United States Patent
Kang et al.

(10) Patent No.: US 9,089,015 B2
(45) Date of Patent: Jul. 21, 2015

(54) LIGHT EMITTING MODULE

(71) Applicant: LG INNOTEK CO., LTD., Seoul (KR)

(72) Inventors: Il Yeong Kang, Seoul (KR); Ki Soo Kwon, Seoul (KR); Keun Tak Joo, Seoul (KR); Tae Young Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/060,904

(22) Filed: Oct. 23, 2013

(65) Prior Publication Data

US 2014/0125226 A1 May 8, 2014

(30) Foreign Application Priority Data

Nov. 2, 2012 (KR) .................. 10-2012-0123757

(51) Int. Cl.
*H05B 37/02* (2006.01)
*H05B 33/08* (2006.01)
*H01L 25/075* (2006.01)

(52) U.S. Cl.
CPC ........ *H05B 37/0209* (2013.01); *H01L 25/0753* (2013.01); *H05B 33/0809* (2013.01); *H05B 33/0824* (2013.01); *H01L 2224/48091* (2013.01); *H01L 2924/1305* (2013.01)

(58) Field of Classification Search
CPC .................................................. H05B 37/0209
USPC .................................... 315/51, 294, 297, 307
See application file for complete search history.

(56) References Cited

U.S. PATENT DOCUMENTS 8,721,097 B2 * 5/2014 Guo et al. ........................ 362/84
2005/0169006 A1 * 8/2005 Wang et al. ................... 362/555

* cited by examiner

*Primary Examiner* — Don Le
(74) *Attorney, Agent, or Firm* — Ked & Associates, LLP

(57) ABSTRACT

Embodiments provide a light emitting module including a body, a plurality of light emitting devices disposed on the body, and a turn-on controller configured to control turn-on of the plurality of light emitting devices. At least some neighboring light emitting devices among the plurality of light emitting devices are spaced apart from one another by different distances.

19 Claims, 7 Drawing Sheets

LIGHT EMITTING MODULE

CROSS REFERENCE TO RELATED APPLICATION

This application claims priority under 35 U.S.C. §119 to Korean Patent Application No. 10-2012-0123757, filed in Korea on 2 Nov. 2012, which is hereby incorporated in its entirety by reference as if fully set forth herein.

BACKGROUND

1. Field

Embodiments relate to light emitting modules.

2. Background

Light emitting devices, such as Light Emitting Diodes (LEDs) or Laser Diodes (LDs), which use group III-V or group II-VI compound semiconductors, are capable of emitting light of various colors, such as red, green, blue, and ultraviolet light, and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety, and environmental friendliness as compared to conventional light sources, such as fluorescent lamps, incandescent lamps, and the like.

Accordingly, application sectors of light emitting devices are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles, and traffic lights.

FIG. 1 is a plan view schematically showing a general light emitting module.

The light emitting module of FIG. 1 includes a plurality of light emitting devices D11 to D14 and D21 to D24 disposed on a body 10. The plurality of light emitting devices D11 to D14 and D21 to D24 are disposed on the body 10 and are spaced apart from one another by a constant distance.

In this case, the number of the light emitting devices D11 to D14 and D21 to D24 to be turned on is gradually increased according to the level of power applied from an external source. For instance, the light emitting devices D11 and D21 may be turned on when a drive voltage having a first level is applied, the light emitting devices D11, D12, D21, and D22 may be turned on when a drive voltage having a second level greater than the first level is applied, the light emitting devices D11 to D13 and D21 to D23 may be turned on when a drive voltage having a third level greater than the second level is applied, and the light emitting devices D11 to D14 and D21 to D24 may be turned on when a drive voltage having a fourth level greater than the third level is applied. In this case, light may be one-sidedly emitted from the top of the light emitting module due to different power consumption or different illuminances of the light emitting devices D11 to D14 and D21 to D24, which may cause uneven light emission.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
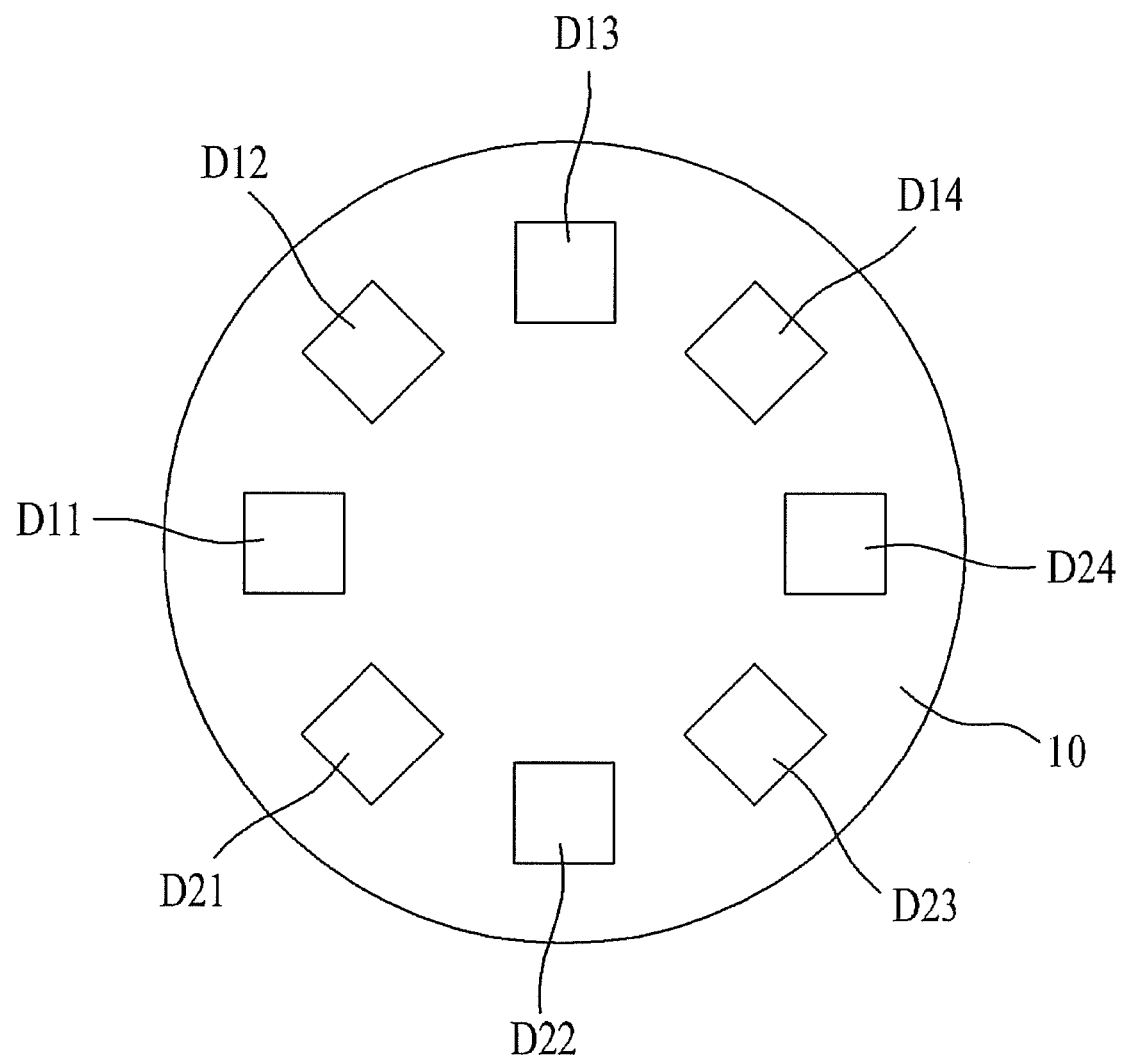
FIG. 1 is a plan view schematically showing a general light emitting module.

Hereinafter, embodiments will be described in detail with reference to the annexed drawings for better understanding. However, it will be apparent that the embodiments may be modified in various ways and the scope of the embodiments should not be construed as being limited to the following description. Thus, the embodiments are provided to ensure more perfect comprehension of the embodiments by one of ordinary skill in the art.

In the following description of the embodiments, it will be understood that, when each element is referred to as being formed "on" or "under" the other element, one element can be directly "on" or "under" the other element or the two elements can be indirectly formed with intervening one or more other elements therebetween. Also, it will also be understood that "on" or "under" one element may contain the meaning of upward or downward on the basis of the element.

In the drawings, the thickness or size of each layer may be exaggerated, omitted, or schematically illustrated for clarity and convenience. In addition, the size of each constituent element does not wholly reflect an actual size thereof.

Figure 2:
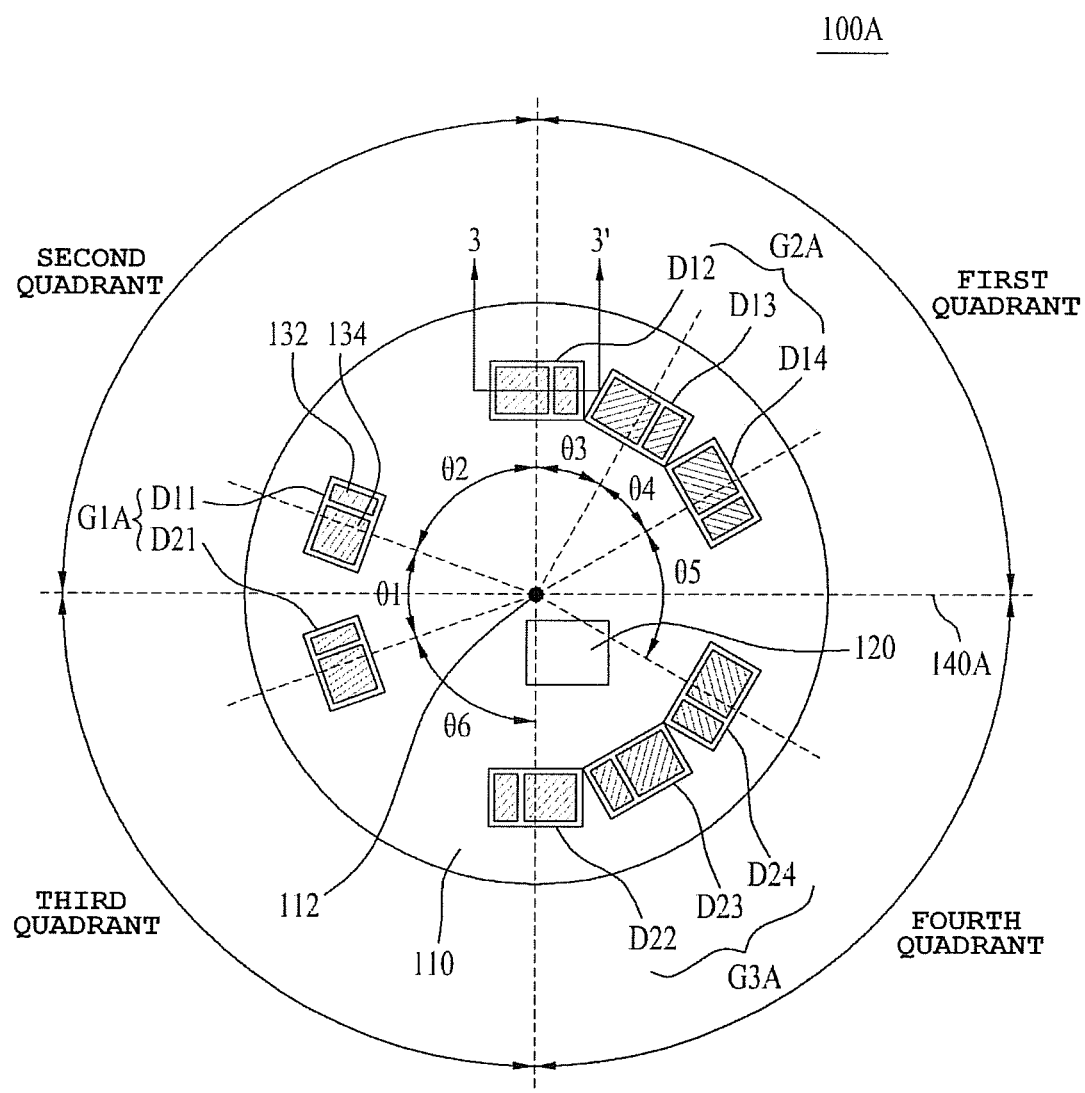
FIG. 2 is a plan view showing a light emitting module according to an embodiment.

FIG. 2 is a plan view showing a light emitting module 100A according to an embodiment.

Referring to FIG. 2, the light emitting module 100A includes a body 110, N light emitting devices, and a turn-on controller 120. Here, N is a natural number of 2 or more.

For convenience, although the embodiment as exemplarily shown in FIG. 2 describes N=8, the embodiment is not limited thereto. That is, the following description will be equally applied even when the light emitting module includes a plurality of light emitting devices smaller or greater in number than 8.

Each of eight light emitting devices D11 to D14 and D21 to D24, for instance, may include a Light Emitting Diode (LED) as a light emitting cell. The LED may include a colored LED configured to emit red, green, blue, or white light, and an ultraviolet (UV) LED configured to emit UV light. In addition, each of the eight light emitting devices D11 to D14 and D21 to D24 may further include n1 and n2 lead frames ($1 \leq n \leq N$). Hereinafter, for convenience of description, the n1 and n2 lead frames will be referred to as first and second lead frames 132 and 134, respectively.

The body 110 may be formed of silicone, a synthetic resin, or a metal. If the body 110 is formed of a conductive material, such as a metal, a surface of the body 110 may be coated with an insulating layer, although this is not shown, to prevent electrical short-circuit between the first and second lead frames 132 and 134.

Figure 3:
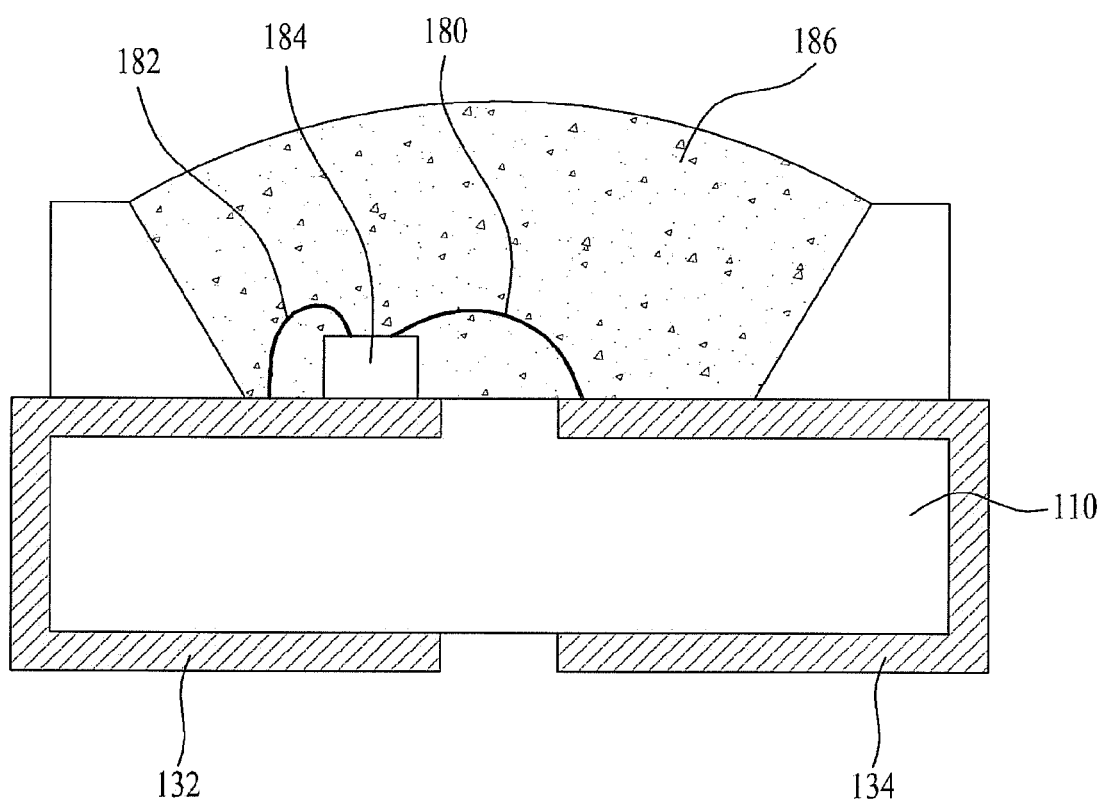
FIG. 3 is a sectional view taken along lines 3-3' of FIG. 2.

FIG. 3 is a sectional view taken along lines 3-3' of FIG. 2. Here, reference numeral 184 represents a light emitting cell included in each of the light emitting devices D11 to D14 and D21 to D24 exemplarily shown in FIG. 2.

Referring to FIGS. 2 and 3, in each of the plurality of light emitting devices D11 to D14 and D21 to D24, the first and second lead frames 132 and 134 are arranged on the body 110 and are electrically spaced apart from each other. Thus, the first lead frame 132 and the second lead frame 134 are electrically separated from each other, and are electrically connected to the light emitting cell 184 of each of the light emitting devices D11 to D14 and D21 to D24 to supply current to the light emitting cell 184. In addition, the first lead frame 132 and the second lead frame 134 may serve not only to reflect light generated by the light emitting cell 184 of each of the light emitting devices D11 to D14 and D21 to D24 to enhance luminous efficiency, but also to externally radiate heat generated by the light emitting cell 184 of each of the light emitting devices D11 to D14 and D21 to D24.

For convenience of description, the plan view of FIG. 2 shows a state before the light emitting cell 184 of each of the light emitting devices D11 to D14 and D21 to D24 is disposed to the first or second lead frame 132 or 134. The light emitting cell 184 of each of the light emitting devices D11 to D14 and D21 to D24 may be electrically connected to the first and second lead frames 132 and 134. That is, the light emitting cell 184 of each of the light emitting devices D11 to D14 and D21 to D24 may be disposed on the first lead frame 132 as exemplarily shown in FIG. 3.

In FIG. 3, the first lead frame 132 and the light emitting cell 184 are connected to each other via a wire 182, and the second lead frame 134 and the light emitting cell 184 are connected to each other via a wire 180. Alternatively, differently from illustration of FIG. 3, the light emitting cell 184 of each of the light emitting devices D11 to D14 and D21 to D24 may be disposed on the second lead frame 134, instead of the first lead frame 132, or may be directly disposed on the body 110. Alternatively, instead of the above-described wire bonding method, the light emitting cell 184 may be electrically connected to the first and second lead frames 132 and 134 via a flip-chip method or die-bonding method, for instance.

A molding structure 186 may envelope and protect the light emitting cell 184. In addition, a fluorescent substance (not shown) may be contained in the molding structure 186 to vary the wavelength of light emitted from the light emitting cell 184. The fluorescent substance may include a garnet-based fluorescent substance, a silicate-based fluorescent substance, a nitride-based fluorescent substance, or an oxynitride-based fluorescent substance. For instance, the garnet-based fluorescent substance may be YAG (Y3Al5O12:Ce3+) or TAG (Tb3Al5O12:Ce3+), the silicate-based fluorescent substance may be (Sr, Ba, Mg, Ca)2SiO4:Eu2+, the nitride-based fluorescent substance may be CaAlSiN3:Eu2+ including SiN, and the oxynitride-based fluorescent substance may be Si6-xAlxOxN8-x:Eu2+(0<x<6) including SiON.

A first wavelength band of light emitted from the light emitting cell 184 is excited by the fluorescent substance to thereby be converted into a second wavelength band of light. The second wavelength band of light may be changed in terms of optical path thereof while passing through a lens (not shown).

The turn-on controller 120 is configured to turn the plurality of light emitting devices D11 to D14 and D21 to D24 on and off. The light emitting devices D11 to D14 have different turn-on frequencies, and the light emitting devices D21 to D24 have different turn-on frequencies. The turn-on controller 120 controls turn-on and turn-off of the plurality of light emitting devices D11 to D14 and D21 to D24 according to the level of power applied from an external source. For example, the ranking of turn-on frequencies may be D11>D12>D13>D14, and may be D21>D22>D23>D24.

The turn-on controller 120 may control turn-on and turn-off of the plurality of light emitting devices D11 to D14 and D21 to D24 in various ways based on the above-described turn-on frequency.

Figure 4:
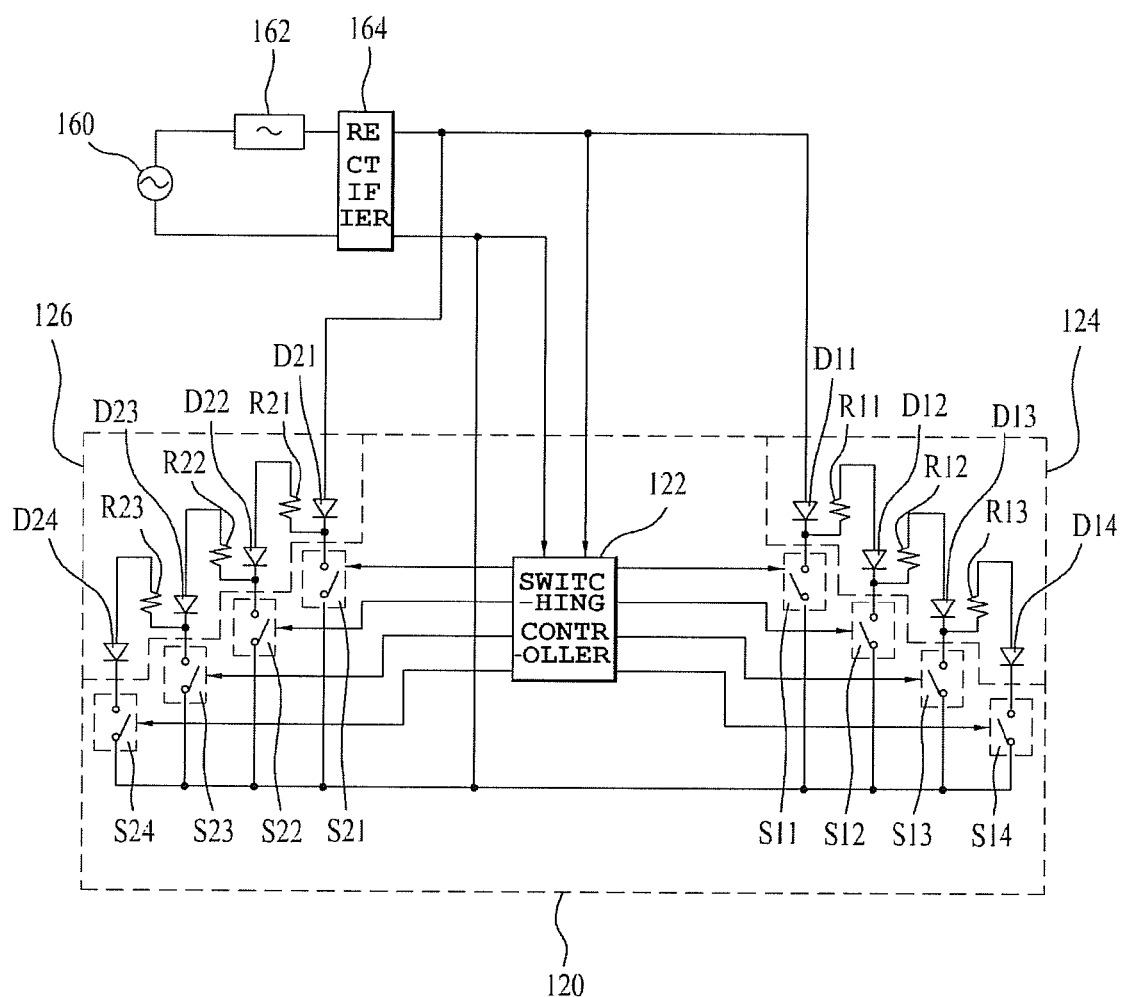
FIG. 4 is a circuit diagram showing the light emitting module according to the embodiment.

FIG. 4 is a circuit diagram showing the embodiment of the light emitting module 100A exemplarily shown in FIG. 2.

The light emitting module 100A of FIG. 4 includes the turn-on controller 120, first and second light emitting arrays 124 and 126, an alternating current (AC) power source 160, a fuse 162, and a rectifier 164.

The AC power source 160 supplies an AC signal. In this case, the AC signal may be an AC voltage (Vac) having an actually effective value of 100V or 200V and a frequency of 50 Hz to 60 Hz.

The fuse 162 serves to protect the light emitting module 100A of FIG. 2 from an AC signal having instantaneously high level. That is, when an instantaneously high AC signal is introduced, the fuse 162 is open to protect the light emitting module 100A. To this end, the fuse 162 may be disposed between the AC power source 160 and the rectifier 164.

The rectifier 164 may be a full-wave diode bridge circuit that rectifies an AC signal supplied from the AC power source 160 to convert the AC signal into a ripple signal. The full-wave diode bridge circuit may include four bridge diodes BD1, BD2, BD3, and BD4. The full-wave diode bridge circuit is well-known, and thus a detailed description of this will hereinafter be omitted.

In this case, the light emitting module 100A may further include a smoother (not shown) that implements smoothing of a ripple signal output from the rectifier 164 to convert the ripple signal into a direct current (DC) signal and output the converted DC signal. The smoother may be disposed between the rectifier 164 and the turn-on controller 120, between the rectifier 164 and the first light emitting array 124, and between the rectifier 164 and the second light emitting array 126. The first light emitting array 124 may include the plurality of light emitting devices D11 to D14 and first to third connection resistors R11 to R13, and the second light emitting array 126 may include the plurality of light emitting devices D21 to D24 and fourth to sixth connection resistors R21 to R23.

The turn-on controller 120 increases the number of ones of the light emitting devices D11 to D14 and D21 to D24 to be turned on as the level of a ripple signal increases within a phase range within which the level of the ripple signal increases from a low value to a high value. In addition, the turn-on controller 120 decreases the number of ones of the turned on light emitting devices D11 to D14 and D21 to D24 as the level of a ripple signal decreases within a phase range within which the level of the ripple signal decreases from a high value to a low value.

To this end, the turn-on controller 120 includes N switches (e.g., S11 to S14 and S21 to S24) and a switching controller 122. The turn-on controller 120 of FIG. 4 is given as an embodiment, and may have various circuit configurations so long as it may control turn-on and turn-off of the light emitting devices D11 to D14 and D21 to D24 according to variation in the level of ripple voltage as described above. Among the N switches (e.g., S11 to S14 and S21 to S24), each of N-2 switches (e.g., S11 to S13 and S21 to S23) is disposed between a contact between a corresponding connection resistor and a corresponding light emitting device and a reference potential point, an N/2th switch (e.g., S14) is disposed between an N/2th light emitting device (e.g., D14) and the reference potential point, and an Nth switch (e.g., S24) is disposed between an Nth light emitting device (e.g., D24) and the reference potential point.

If N is 8, a first switch S11 is disposed between a contact between the first connection resistor R11 and a cathode of the first light emitting device D11 and the reference potential point, and a second switch S12 is disposed between a contact between the second connection resistor R12 and a cathode of the second light emitting device D12 and the reference potential point. In addition, a third switch S13 is disposed between a contact between the third connection resistor R13 and a cathode of the third light emitting device D13 and the reference potential point, and a fourth switch S14 is disposed between a cathode of the fourth light emitting device D14 and the reference potential point.

A fifth switch S21 is disposed between a contact between the fourth connection resistor R21 and a cathode of the fifth light emitting device D21 and the reference potential point, a sixth switch S22 is disposed between a contact between the fifth connection resistor R22 and a cathode of the sixth light emitting device D22 and the reference potential point, a seventh switch S23 is disposed between a contact between the sixth connection resistor R23 and a cathode of the seventh light emitting device D23 and the reference potential point, and an eighth switch S24 is disposed between a cathode of the eighth light emitting device D24 and the reference potential point.

To this end, each of the N switches (e.g., S11 to S14 and S21 to S24) may be a bipolar transistor or field-effect transistor. If each of the N switches (e.g., S11 to S14 and S21 to S24) takes the form of a bipolar transistor, a switching control signal output from the switching controller 122 may be transmitted to a base of the bipolar transistor. Alternatively, if each of the N switches (e.g., S11 to S14 and S21 to S24) takes the form of a field-effect transistor, a switching control signal output from the switching controller 122 may be transmitted to a gate of the field-effect transistor.

The switching controller 122 generates a switching control signal to control opening/closing of the N switches (e.g., S11 to S14 and S21 to S24) according to the level of a ripple signal.

Although not shown, the light emitting module 100A may further include a current limit resistor, a voltage regulator, a clock generator, a resetter, and a counter, etc.

The current limit resistor may be disposed between the switching controller 122 and each switch (e.g., S11 to S14 and S21 to S24), and the voltage regulator may regulate the level of a ripple signal to output the ripple signal having the regulated level to the switching controller 122. The voltage regulator may be disposed between the rectifier 164 and the switching controller 122. In addition, the clock generator serves to supply a clock signal to the switching controller 122, and the resetter serves to reset operation of the switching controller 122 when power is shut off or when power is input. The counter serves to count the number of clocks generated by the clock generator. The number of clocks counted by the counter and an instantaneous value of ripple voltage may be matched with each other and stored, in the form of look-up table, in a storage unit (not shown) that is included in the switching controller 122. A time when an instantaneous value of voltage regulated by the voltage regulator reaches a minimum level (MIN) is a time when the counter begins a counting operation. This serves to allow the switching controller 122 to generate a signal to turn off a corresponding switch among the N switches (e.g., S11 to S14 and S21 to S24) according to the number of clocks counted by the counter.

Hereinafter, assuming that N is 8, with regard to the light emitting module 100A having a configuration exemplified in FIG. 4, operation of the turn-on controller 120 will be described with reference to the accompanying drawings. In this case, the above-described ripple signal is described as ripple voltage, but the embodiment is not limited thereto.

Figure 5:
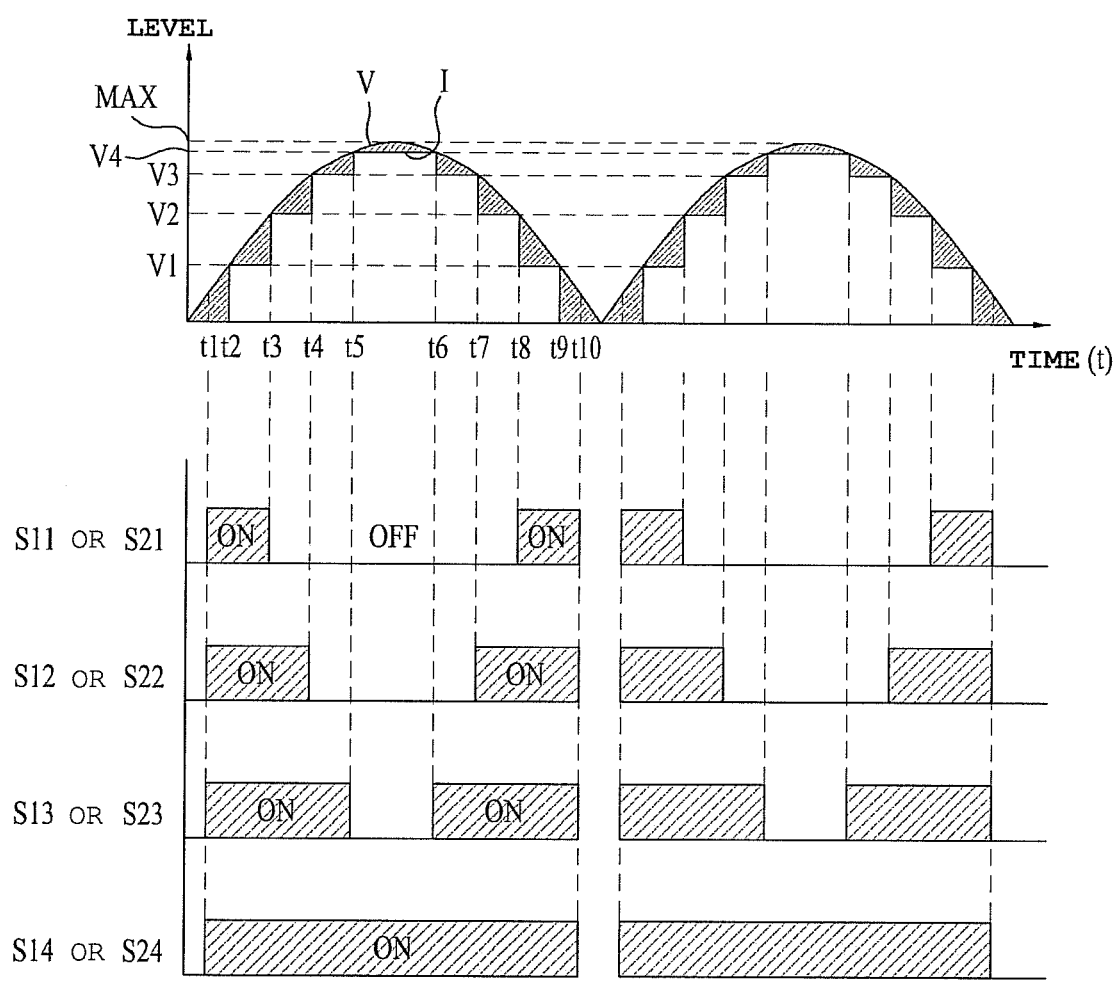
FIG. 5 is a waveform diagram of ripple voltage and ripple current explaining operation of a turn-on controller of FIG. 4 to control first and second light emitting arrays.

FIG. 5 is a waveform diagram of ripple voltage (V) and ripple current (I) explaining operation of the turn-on controller 120 of FIG. 4 to control the first and second light emitting arrays 124 and 126.

Here, waveforms, shown below the graph of ripple voltage and current, represent switching control signals output from the switching controller 122 to the respective switches. That is, if the switching control signal is "ON", the corresponding switch is turned on, and if the switching control signal is "OFF", the corresponding switch is turned off.

Referring to FIGS. 4 and 5, the light emitting devices D11 to D41 and D21 to D24 may be set in such a way that the light emitting devices D11 and D21 are turned on if ripple voltage is within a range of V1 or more and less than V2, the light emitting devices D11, D12, D21, and D22 are turned on if ripple voltage is within a range of V2 or more and less than V3, the light emitting devices D11 to D13 and D21 to D23 are turned on if ripple voltage is within a range of V3 or more and less than V4, and all of the light emitting devices D11 to D14 and D21 to D24 are turned on if ripple voltage is V4 or more.

As such, the switching controller 122 switches the switches S11 to S14 and S21 to S24 through a switching control signal such that the number of ones of the light emitting devices D11 to D14 and D21 to D24 to be turned on increases according to variation in the level of ripple voltage within a phase range within which ripple voltage increases from a low level to a high level.

In addition, the switching controller 122 switches the switches S11 to S14 and S21 to S24 through a switching control signal such that the number of ones of the turned on light emitting devices D11 to D14 and D21 to D24 decreases according to variation in the level of ripple voltage within a phase range within which ripple voltage decreases from a high level to a low level.

First, in a state in which the switching controller 122 is reset by the resetter, ripple voltage is output from the rectifier 164 to each of the first and second light emitting arrays 124 and 126 and the switching controller 122. During this reset period, all of the light emitting devices D11 to D14 and D21 to D24 are turned off. Switching the switches S11 to S14 and S21 to S24 according to the level of ripple voltage by the switching controller 122 will hereinafter be described.

After reset, the switching controller 122 of the turn-on controller 120 turns on all of the N switches S11 to S14 and S21 to S24 when ripple voltage reaches a drive initiation value (time t1).

Thereafter, turn-on of the light emitting devices D11 and D21 is initiated when ripple voltage reaches V1 (time t2). In this case, although all of the N switches S11 to S14 and S21 to S24 are turned on, only the light emitting devices D11 and D21 are turned on.

Thereafter, the switching controller 122 turns off only the switches S11 and S21 when ripple voltage reaches V2 (time t3). Accordingly, the ripple voltage is supplied to the light emitting devices D11, D12, D21, and D22, thus causing all of the light emitting devices D11, D12, D21, and D22 to be turned on. In this case, although all of the switches S12 to S14 and S22 to S24 are turned on, only the light emitting devices D11, D12, D21, and D22 are turned on.

Thereafter, the switching controller 122 turns off the switches S12 and S22 when ripple voltage reaches V3 (time t4). Accordingly, the ripple voltage is supplied to all of the light emitting devices D11 to D13 and D21 to D23 in an off state of the switches S11, S12, S21, and S22, thus causing all of the light emitting devices D11 to D13 and D21 to D23 to be turned on. In this case, although all of the switches S13, S23, S14, and S24 are turned on, only the light emitting devices D11 to D13 and D21 to D23 are turned on.

Thereafter, the switching controller 122 turns off the switches S13 and S23 when ripple voltage reaches V4 (time t5). Accordingly, in a state in which all of the switches S11 to S13 and S21 to S23 are turned off and only the switches S14 and S24 are turned on, all of the light emitting devices D11 to D14 and D21 to D24 receive the ripple voltage to thereby be turned on.

Thereafter, the switching controller 122 turns on the switches S13 and S23 when ripple voltage reaches a maximum level MAX and thereafter is reduced to V4 (time t6). Since the level of ripple voltage is lower than V4, the light emitting devices D14 and D24 are turned off and only the light emitting devices D11 to D13 and D21 to D23 remain in an on state.

Thereafter, the switching controller 122 turns on the switches S12 and S22 when ripple voltage again reaches V3 (time t7). Since the level of ripple voltage is lower than V3, the light emitting devices D13 and D23 are turned off and only the light emitting devices D11, D12, D21, and D22 remain in an on state.

Thereafter, the switching controller 122 again turns on the switches S11 and S21 when ripple voltage again reaches V2 (time t8). Since the level of ripple voltage is lower than V2, the light emitting devices D12 and D22 are turned off and only the light emitting devices D11 and D21 remain in an on state.

Thereafter, when ripple voltage again reaches V1 (time t9), all of the light emitting devices D11 to D14 and D21 to D24 are turned off because the level of ripple voltage is lower than V1.

Hereinafter, in terms of the turn-on frequency, the light emitting device D11 is ranked No. 1, the light emitting device D12 is ranked No. 2, the light emitting device D13 is ranked No. 3, and the light emitting device D14 is ranked No. 4. In addition, in terms of the turn-on frequency, the light emitting device D21 is ranked No. 1, the light emitting device D22 is ranked No. 2, the light emitting device D23 is ranked No. 3, and the light emitting device D24 is ranked No. 4. In this condition, spatial arrangement of the light emitting devices D11 to D14 and D21 to D24 of the light emitting module 100A is as follows. For convenience of description, it is assumed that, among the plurality of light emitting devices D11 to D14 and D21 to D24, the light emitting devices D11 and D21 have the same turn-on frequency, the light emitting devices D12 and D22 have the same turn-on frequency, the light emitting devices D13 and D23 have the same turn-on frequency, and the light emitting devices D14 and D24 have the same turn-on frequency, but, the embodiment is not limited thereto. In addition, a distance between the neighboring light emitting devices refers to a distance between centers of the neighboring light emitting devices, but is not limited thereto.

The plurality of light emitting devices D11 to D14 and D21 to D24 may be symmetrically arranged about any one line 140A that extends across an upper surface of the body 110. In this case, a distance between the light emitting devices D22 and D23 is equal to a distance (θ3) between the light emitting devices D12 and D13, and a distance between the light emitting devices D23 and D24 is equal to a distance (θ4) between the light emitting devices D13 and D14. Referring to FIGS. 2 to 4, among the plurality of light emitting devices D11 to D14 and D21 to D24, the light emitting devices D11 to D14 disposed at one side about the line 140A are connected to one another in series to constitute the first light emitting array 124, and the light emitting devices D21 to D24 disposed at the other side about the line 140A are connected to one another in series to constitute the second light emitting array 126. In this case, as described above with reference to FIGS. 4 and 5, the turn-on controller 120 may sequentially turn on or turn off the light emitting devices of the first and second light emitting arrays 124 and 126 in proportion to the level of power applied from an external source.

In the case of the light emitting devices D11 to D14 and D21 to D24 exemplarily shown in FIG. 1, the neighboring light emitting devices D11 and D12, D12 and D13, D13 and D14, D14 and D24, D24 and D23, D23 and D22, and D22 and D21 may be equidistantly spaced apart from each other. On the other hand, in the case of the light emitting devices D11 to D14 and D21 to D24 of the embodiment exemplarily shown in FIG. 2, the respective neighboring light emitting devices are spaced apart from each other by different distances. That is, a distance between the neighboring light emitting devices D11 and D12, a distance between the neighboring light emitting devices D11 and D21, a distance between the neighboring light emitting devices D12 and D13, a distance between the neighboring light emitting devices D13 and D14, and a distance between the neighboring light emitting devices D14 and D24 may differ. In addition, a distance between the neighboring light emitting devices D21 and D22, a distance between the neighboring light emitting devices D22 and D23, and a distance between the neighboring light emitting devices D23 and D24 may differ.

According to an embodiment, distances between the light emitting devices D11 to D14 and D21 to D24 may be determined to enhance the uniformity ratio of illuminance of light emitted from the light emitting module 100A even in the case in which the light emitting devices D11 to D14 and D21 to D24 consume different levels of power.

In the light emitting module 100A exemplarily shown in FIG. 2, the plurality of light emitting devices D11 to D14 and D21 to D24 may be equidistantly disposed about one point 112 in a radial direction.

The plurality of light emitting devices D11 to D14 and D21 to D24 may be gathered into different groups. For instance, in the light emitting module 100A of FIG. 2, the light emitting devices D11 and D21 may be gathered into a first group G1A, the light emitting devices D12, D13, and D14 may be gathered into a second group G2A, and the light emitting devices D22, D23, and D24 may be gathered into a third group G3A.

In this case, the light emitting devices included in at least one of the groups may have the same the turn-on ranking. For instance, the turn-on ranking of the light emitting devices D11 and D21 included in the first group (e.g., G1A) may be equal to each other. Alternatively, the light emitting devices included in at least one group among the groups G1A, G2A, and GA3 may have different turn-on rankings. For instance, the light emitting devices D12, D13, and D14 of the second group G2A may have different turn-on rankings, and the light emitting devices D22, D23, and D24 of the third group G3A may have different turn-on rankings.

In addition, a distance between the groups may be greater than a distance between the neighboring light emitting devices within any one of the groups G1A, G2A, and GA3. For example, it is assumed that a distance between the first group G1A and the second group G2A is θ2, a distance between the second group G2A and the third group G3A is θ5, and a distance between the third group G3A and the first group G1A is θ6. In addition, it is assumed that a distance between the neighboring light emitting devices D11 and D21 within the first group G1A is θ1, a distance between the neighboring light emitting devices D12 and D13 within the second group G2A is θ3, and a distance between the neighboring light emitting devices D13 and D14 within the second group G2A is θ4. Under these assumptions, each of the distances θ2, θ5, and θ6 between the groups may be greater than distances θ1, θ3, or θ4 between the neighboring light emitting devices within any one group.

In addition, each of the distances θ2, θ5, and θ6 between the neighboring groups G1A and G2A, G2A and G3A, or G3A and G1A among the plurality of groups G1A, G2A, and G3A may be within an angular range of 40° to 90° about one point 112. For instance, each of the distances θ2, θ5, and θ6 may be 70°.

A distance between the neighboring light emitting devices included in any one group among the plurality of groups G1A, G2A, and G3A may be within an angular range of 30° to 80° about one point 112. For instance, the distance θ1 between the neighboring light emitting devices D11 and D21 within the first group G1A may be 40°, the distance θ3 between the neighboring light emitting devices D12 and D13 within the second group G2A may be 30°, and the distance θ4 between the neighboring light emitting devices D13 and D14 within the second group G2A may be 60°.

In addition, at least some of the plurality of light emitting devices D11 to D14 and D21 to D24 may be sequentially disposed in a given direction according to the turn-on frequency ranking. For instance, the plurality of light emitting devices D11 to D14 and D21 to D24 may be sequentially disposed in a clockwise or counterclockwise direction according to the turn-on frequency ranking from the light emitting devices D11 and D21 having the highest turn-on frequency ranking to the light emitting devices D14 and D24 having the lowest turn-on frequency ranking.

That is, as exemplarily shown in FIG. 2, sequentially in a clockwise direction, the light emitting device D12, the turn-on frequency of which is ranked No. 2, may be disposed at the right side of the light emitting device D11, the turn-on frequency of which is ranked No. 1, the light emitting device D13, the turn-on frequency of which is ranked No. 3, may be disposed at the right side of the light emitting device D12, and the light emitting device D14, the turn-on frequency of which is ranked No. 4, may be disposed at the right side of the light emitting device D13. Alternatively, according to another embodiment, differently from illustration of FIG. 2, sequentially in a counterclockwise direction, the light emitting device D12, the turn-on frequency of which is ranked No. 2, may be disposed at the left side of the light emitting device D11, the turn-on frequency of which is ranked No. 1, the light emitting device D13, the turn-on frequency of which is ranked No. 3, may be disposed at the left side of the light emitting device D12, and the light emitting device D14, the turn-on frequency of which is ranked No. 4, may be disposed at the left side of the light emitting device D13.

Similarly, as exemplarily shown in FIG. 2, sequentially in a counterclockwise direction, the light emitting device D22, the turn-on frequency of which is ranked No. 2, may be disposed at the right side of the light emitting device D21, the turn-on frequency of which is ranked No. 1, the light emitting device D23, the turn-on frequency of which is ranked No. 3, may be disposed at the right side of the light emitting device D22, and the light emitting device D24, the turn-on frequency of which is ranked No. 4, may be disposed at the right side of the light emitting device D23. Alternatively, according to another embodiment, differently from illustration of FIG. 2, sequentially in a clockwise direction, the light emitting device D22, the turn-on frequency of which is ranked No. 2, may be disposed at the left side of the light emitting device D21, the turn-on frequency of which is ranked No. 1, the light emitting device D23, the turn-on frequency of which is ranked No. 3, may be disposed at the left side of the light emitting device D22, and the light emitting device D24, the turn-on frequency of which is ranked No. 4, may be disposed at the left side of the light emitting device D23. In addition, the disposition density of the plurality of light emitting devices D11 to D14 and D21 to D24 may vary according to positions on the body 110. For instance, referring to FIG. 2, the disposition density of the plurality of light emitting devices D11 to D14 and D21 to D24 may differ in the first quadrant, the second quadrant, the third quadrant, and the fourth quadrant. In addition, the disposition density of the plurality of light emitting devices D11 to D14 and D21 to D24 may be equal or different by the groups on the body 110. That is, the disposition density of the first group G1A disposed over the second quadrant and the third quadrant may be less than the disposition density of the second group G2A disposed over the first quadrant and the second quadrant. The disposition density of the first group G1A disposed over the second quadrant and the third quadrant may be less than the disposition density of the third group G3A disposed over the third quadrant and the fourth quadrant. In addition, the disposition density of the second group G2A disposed over the first quadrant and the second quadrant may be equal to the disposition density of the third group G3A disposed over the third quadrant and the fourth quadrant.

Figure 6:
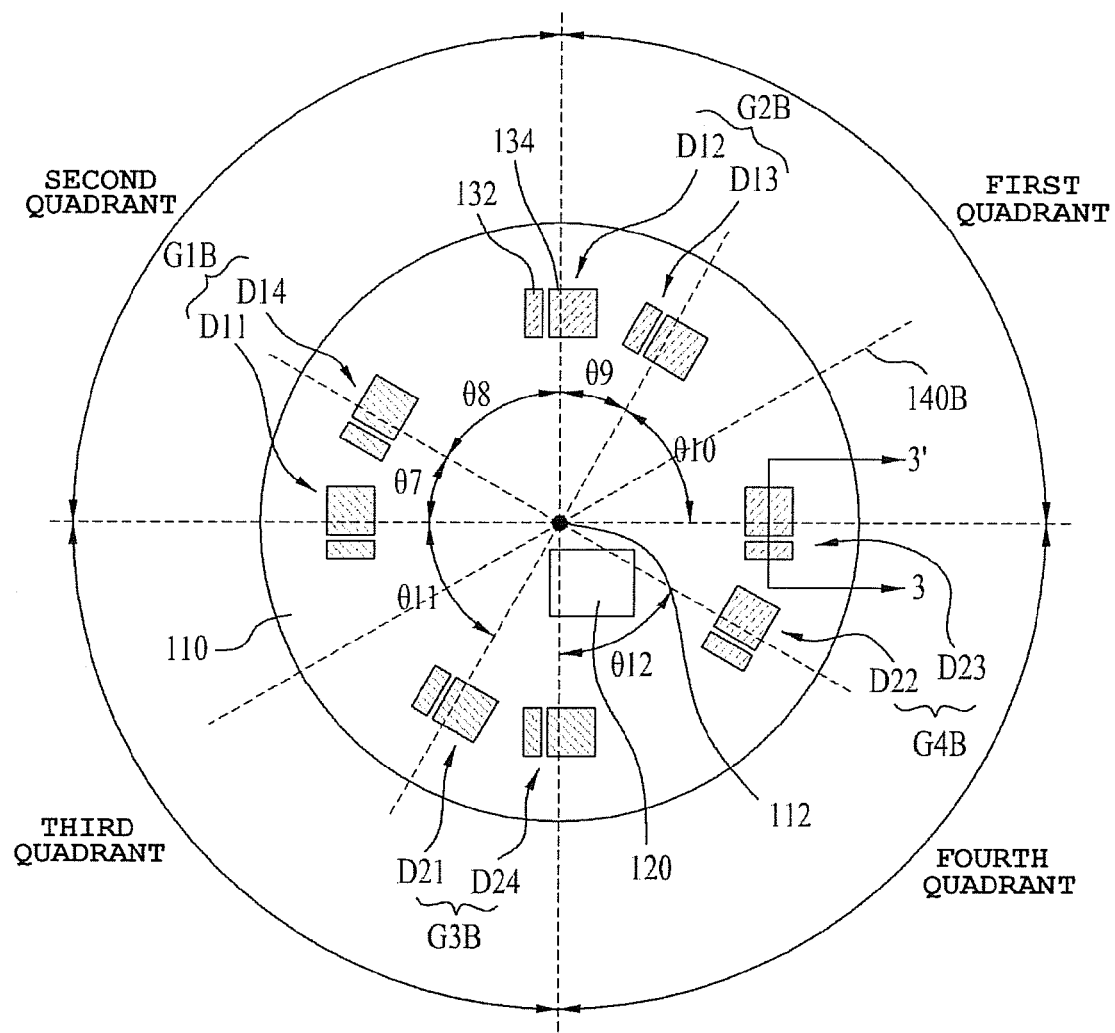
FIG. 6 is a sectional view showing a light emitting module according to another embodiment.

FIG. 6 is a sectional view showing a light emitting module 100B according to another embodiment.

Differently from illustration of FIG. 2, in the light emitting module 100B exemplarily shown in FIG. 6, the sum of the turn-on frequency rankings of light emitting devices included in each of first to fourth groups G1B to G4B may be equal. That is, as described above, since the turn-on frequency of the light emitting devices decreases in the sequence of D11, D12, D13, and D14 and in the sequence of D21, D22, D23, and D24, it is assumed that the turn-on frequency of the light emitting devices D11, D12, D13, and D14 are ranked No. 1, No. 2, No. 3, and No. 4 respectively, and the turn-on frequency of the light emitting devices D21, D22, D23, and D24 are ranked No. 1, No. 2, No. 3, and No. 4. Under this assumption, the sum of the turn-on frequency rankings of the light emitting devices D11 and D14 included in the first group G1B is 1+4=5, the sum of the turn-on frequency rankings of the light emitting devices D12 and D13 included in the second group G2B is 2+3=5, the sum of the turn-on frequency rankings of the light emitting devices D21 and D24 included in the third group G3B is 1+4=5, and the sum of the turn-on frequency rankings of the light emitting devices D22 and D23 included in the fourth group G4B is 2+3=5. Thus, all sums are the same.

Differently from the light emitting module 100A exemplarily shown in FIG. 2, in the light emitting module 100B exemplarily shown in FIG. 6, the plurality of groups G1B, G2B, G3B, and G4B may be equidistantly disposed. That is, a distance θ8 between the first group G1B and the second group G2B, a distance θ10 between the second group G2B and the fourth group G4B, a distance θ11 between the first group G1B and the third group G3B, and a distance θ12 between the third group G3B and the fourth group G4B may be equal to one another.

In addition, differently from the light emitting module 100A exemplarily shown in FIG. 2, in the light emitting module 100B exemplarily shown in FIG. 6, the disposition density of the light emitting devices D11 to D14 and D21 to D24 on the body 110 may be even. For instance, referring to FIG. 6, the disposition density of the plurality of light emitting devices D11 to D14 and D21 to D24 may be equal in the first quadrant, the second quadrant, the third quadrant, and the fourth quadrant. In addition, the disposition density of the plurality of light emitting devices D11 to D14 and D21 to D24 may be equal by the groups on the body 110. That is, the first group G1B, the second group G2B, the third group G3B, and the fourth group G4B may have the same disposition density.

The light emitting module 100B as exemplarily shown in FIG. 6 is equal to the light emitting module 100A as exemplarily shown in FIG. 2 except for the above-described differences, and therefore a detailed description of the same parts will hereinafter be omitted. In particular, the light emitting module 100B as exemplarily shown in FIG. 6 is equally operated to the light emitting module 100A as exemplarily shown in FIG. 2 despite a different disposition.

In the light emitting module 100A exemplarily shown in FIG. 2, the disposition density of the light emitting devices D11 to D14 disposed at one side of the line 140A is equal to the disposition density of the light emitting devices D21 to D24 disposed at the other side of the line 140A. Likewise, in the light emitting module 100B exemplarily shown in FIG. 6, the disposition density of the light emitting devices D11 to D14 disposed at one side of a line 140B may be equal to the disposition density of the light emitting devices D21 to D24 disposed at the other side of the line 140B.

Referring to FIG. 6, the light emitting devices D11 to D14 and D21 to D24 may be symmetrically disposed about the line 140B that extends across the upper surface of the body 110 in the same manner as that of FIG. 2. Through this symmetrical configuration, a distance between the light emitting devices D22 and D23 may be equal to a distance θ9 between the light emitting devices D12 and D13, and a distance between the light emitting devices D21 and D24 may be equal to a distance θ7 between the light emitting devices D11 and D14.

Similar to the first group G1A exemplarily shown in FIG. 2, each of the plurality of groups may include a pair of light emitting devices. For instance, referring to FIG. 6, the first group G1B may include a pair of light emitting devices D11 and D14, the second group G2B may include a pair of light emitting devices D12 and D13, a third group G3B may include a pair of light emitting devices D21 and D24, and the fourth group G4B may include a pair of light emitting devices D22 and D23.

Hereinafter, the uniformity ratio of illuminance of the previously described conventional light emitting module exemplarily shown in FIG. 1 and the uniformity ratio of illuminance of the light emitting modules 100A and 100B exemplarily shown in FIGS. 2 and 6 will be compared with each other. To this end, it is assumed that power consumed by the light emitting devices D11, D12, D13, and D14 are 1.37, 1.01, 1.00, and 0.79, respectively, power consumed by the light emitting devices D21, D22, D23, and D24 are 1.37, 1.01, 1.00, and 0.79, respectively, θ1=θ5=40°, θ2=θ6=70°, θ3=30°, θ4=60°, θ7=30°, θ8=θ12=60°, θ9=30°, and θ10=θ11=60°, and the radius of the body 110 in the form of a planar disc exemplarily shown in FIGS. 2 and 6 is 16.

To measure the uniformity ratio of illuminance, the circular body 110 exemplarily shown in FIGS. 1, 2 and 6 was divided into the first quadrant, the second quadrant, the third quadrant, and the fourth quadrant, and illuminance of each quadrant was calculated. In general, consumed power is proportional to the velocity of light, and therefore illuminance of each quadrant may be acquired by multiplying consumed power by a constant F. The illuminance of the first to fourth quadrants in the conventional light emitting module exemplarily shown in FIG. 1 is represented by the following Equation 1, the illuminance of the first to fourth quadrants in the light emitting module 100A exemplarily shown in FIG. 2 is represented by the following Equation 2, and the illuminance of the first to fourth quadrants in the light emitting module 100B exemplarily shown in FIG. 6 is represented by the following Equation 3.

First Quadrant: $0.5F+0.79F+0.4F=1.69F$

Second Quadrant: $0.5F+1.01F+0.67F=2.18F$

Third Quadrant: $0.67F+1.37F+0.5F=2.54F$

Fourth Quadrant: $0.5F+1F+0.4F=1.9F$  Equation 1

First Quadrant: $0.5F+1F+0.79F=2.29F$

Second Quadrant: $0.5F+1.37F=1.87F$

Third Quadrant: $1.37F+0.5F=1.87F$

Fourth Quadrant: $0.5F+1F+0.79F=2.29F$  Equation 2

First Quadrant: $0.5F+1F+0.5F=2F$

Second Quadrant: $0.5F+0.79F+0.67F=1.96F$

Third Quadrant: $0.67F+1.37F+0.4F=2.44F$

Fourth Quadrant: $0.4F+1F+0.5F=1.9F$  Equation 3

The uniformity ratio of illuminance of the light emitting modules exemplarily shown in FIGS. 1, 2, and 6 is calculated using the following Equation 4.

$$\frac{(\text{Max} - \text{Min})}{(\text{Max} \times \text{Min})} \times 100 \qquad \text{Equation 4}$$

Here, Max is the maximum value among average illuminance values of the first quadrant to the fourth quadrant, and Min is the minimum value among the average illuminance values of the first quadrant to the fourth quadrant.

The uniformity ratio of illuminance of the conventional light emitting module exemplarily shown in FIG. 1 acquired using Equations 1 and 4 is represented by the following Equation 5, the uniformity ratio of illuminance of the light emitting module 100A according to the embodiment of FIG. 2 acquired using Equations 2 and 4 is represented by the following Equation 6, and the uniformity ratio of illuminance of the light emitting module 100B according to the embodiment of FIG. 6 acquired using Equations 3 and 4 is represented by the following Equation 7.

$$\frac{(2.54 - 1.69)}{(2.54 \times 1.69)} \times 100 = 19.8\% \qquad \text{Equation 5}$$

$$\frac{(2.29 - 1.87)}{(2.29 \times 1.87)} \times 100 = 9.8\% \qquad \text{Equation 6}$$

$$\frac{(2.44 - 1.9)}{(2.44 \times 1.9)} \times 100 = 11.6\% \qquad \text{Equation 7}$$

Through comparison of Equation 5 to Equation 7, it will be appreciated that 9.8% and 11.6% of the uniformity ratios of illuminance of the light emitting modules 100A and 100B as shown in Equation 6 and Equation 7, respectively, is lower than 19.8% of the uniformity ratio of illuminance of the conventional light emitting module as shown in Equation 5. Due to the lower uniformity ratio of illuminance, the light emitting modules 100A and 100B of the embodiments may achieve more even light emission than the conventional light emitting module.

In the case of the light emitting module according to the embodiment, a plurality of light emitting modules may define an array on a board, and optical members, such as a light guide panel, a prism sheet, a diffusive sheet, a fluorescent sheet, etc., may be disposed in an optical path of light emitted from the light emitting modules. The light emitting modules, the board, and the optical members may function as a backlight unit or lighting unit. For instance, a lighting system may include a backlight unit, a lighting unit, an indicator, a lamp, a street lamp, and the like.

Figure 7:
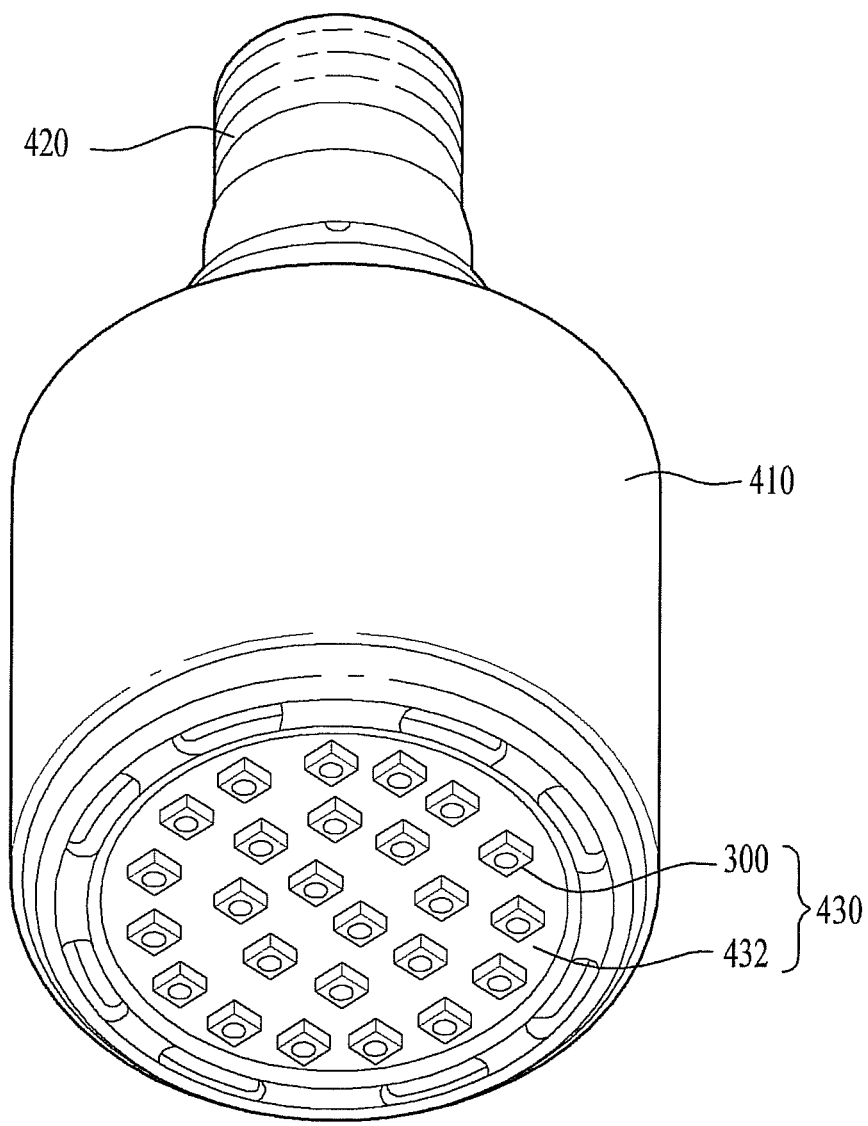
FIG. 7 is a perspective view showing a lighting unit according to an embodiment.

FIG. 7 is a perspective view showing a lighting unit 400 according to an embodiment. The lighting unit 700 of FIG. 7 is given as one example of a lighting system and is not limited to the embodiment.

In the embodiment, the lighting unit 400 may include a case body 410, a connection terminal 420 disposed to the case body 410 to receive power from an external source, and a light emitting module unit 430 disposed to the case body 410.

The case body 410 may be formed of a material having good heat radiation characteristics. For instance, the case body 410 may be formed of a metal or a resin.

The light emitting module unit 430 may include a board 432, and at least one light emitting module 300 disposed on the board 432.

The board 432 may be formed by printing a circuit pattern on an insulator. For instance, the board 432 may include a general Printed Circuit Board (PCB), a metal core PCB, a flexible PCB, and a ceramic PCB.

The board 432 may be formed of a material to effectively reflect light, or the board 432 may have a colored surface to effectively reflect light, e.g., a white or silver surface.

The at least one light emitting module 300 may be disposed on the board 432. The light emitting module 300 may correspond to the light emitting module 100A or 100B exemplarily shown in FIG. 2 or 6.

The light emitting module unit 430 may be a combination of various light emitting modules 300 to acquire desired color and brightness. For instance, to acquire a high color rendering index (CRI), white, red, and green light emitting diodes may be combined to constitute an array.

The connection terminal 420 may be electrically connected to the light emitting module unit 430 to supply power. In the embodiment, the connection terminal 420 is spirally fitted and coupled to an external power source in a socket coupling manner, but the disclosure is not limited thereto. For instance, the connection terminal 420 may take the form of a pin to be inserted into an external power source, or may be connected to an external power source via a wiring.

As is apparent from the above description, in a light emitting module according to an embodiment, light emitting devices are disposed in consideration of power consumption deviation, which may result in enhanced uniformity ratio of illuminance and even light emission throughout the light emitting module.

Embodiments provide light emitting modules which may achieve even light emission.

In one embodiment, a light emitting module includes a body, a plurality of light emitting devices disposed on the body, and a turn-on controller configured to control turn-on of the plurality of light emitting devices, wherein at least some neighboring light emitting devices among the plurality of light emitting devices are spaced apart from one another by different distances.

The plurality of light emitting devices may be equidistantly disposed on the body about one point in a radial direction.

The plurality of light emitting devices may be gathered into a plurality of different groups.

A distance between the groups may be greater than a distance between neighboring light emitting devices within any one of the groups.

At least some of the plurality of light emitting devices may be disposed in a given direction according to turn-on frequency ranking.

The disposition density of the plurality of light emitting devices may vary according to positions on the body.

The sum of turn-on frequency rankings of the light emitting devices included in each of the plurality of groups may be equal.

The plurality of groups may be spaced apart from one another by different distances or by the same distance.

The disposition density of the light emitting devices may be even on the body.

Each of the plurality of groups may have the same disposition density of the light emitting devices.

The light emitting devices included in at least one of the groups may have the same turn-on ranking.

The light emitting devices included in at least one of the groups may have different turn-on rankings.

The plurality of light emitting devices may be symmetrically disposed about any one line that extends across an upper surface of the body.

Some of the plurality of light emitting devices arranged at one side of the line may be connected to one another in series to constitute a first light emitting array, some of the plurality of light emitting devices arranged at the other side of the line may be connected to one another in series to constitute a second light emitting array, and the turn-on controller may sequentially turn on the light emitting devices of the first and second light emitting arrays in proportion to the level of power applied from an external source.

The turn-on controller may sequentially turn off the light emitting devices of the first and second light emitting arrays in proportion to the level of power applied from the external source.

Each of the plurality of light emitting devices may include a light emitting cell configured to emit light, and n1 and n2 lead frames (here, $1 \leq n \leq N$) disposed on the body so as to be electrically connected to the light emitting cell and electrically spaced apart from each other.

A distance between neighboring groups among the plurality of groups may be within an angular range of 40° to 90° about the point.

A distance between neighboring light emitting devices included in any one of the plurality of groups may be within an angular range of 30° to 80° about the point.

Each of the plurality of groups may include a pair of light emitting devices.

In another embodiment, a light emitting module may include a body, a plurality of light emitting devices equidistantly disposed on the body about one point in a radial direction, the light emitting devices being gathered into a plurality of different groups, and a turn-on controller configured to control turn-on of the plurality of light emitting devices, wherein at least some neighboring light emitting devices among the plurality of light emitting devices are spaced apart from one another by different distances, and wherein the sum of turn-on frequency rankings of the light emitting devices included in each of the plurality of groups is equal.

The plurality of groups may be equidistantly spaced apart from one another.

In another embodiment, a light emitting module may include a body, a plurality of light emitting devices symmetrically disposed on the body about any one line that extends across an upper surface of the body, and a turn-on controller configured to control turn-on of the plurality of light emitting devices, wherein at least some neighboring light emitting devices among the plurality of light emitting devices are spaced apart from one another by different distances.

Some of the plurality of light emitting devices disposed at one side of the line may be connected to one another in series to constitute a first light emitting array, wherein some of the plurality of light emitting devices disposed at the other side of the line are connected to one another in series to constitute a second light emitting array, and wherein the turn-on controller sequentially turns on the light emitting devices of the first and second light emitting arrays in proportion to the level of power applied from an external source.

The turn-on controller sequentially may turn off the light emitting devices of the first and second light emitting arrays in proportion to the level of power applied from the external source.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module, comprising:
a body;
a plurality of light emitting devices disposed on the body; and
a turn-on controller configured to control turn-on of the plurality of light emitting devices,
wherein at least some neighboring light emitting devices among the plurality of light emitting devices are spaced apart from one another by different distances,
wherein each of the plurality of light emitting devices includes
a light emitting cell configured to emit light, and
$n_1$ and $n_2$ lead frames (here, $1 \le n \le N$) disposed on the body so as to be electrically connected to the light emitting cell and electrically spaced apart from each other.

2. The module according to claim 1, wherein the plurality of light emitting devices is equidistantly disposed on the body about one point in a radial direction.

3. The module according to claim 2, wherein the plurality of light emitting devices is gathered into a plurality of different groups.

4. The module according to claim 3, wherein a distance between the groups is greater than a distance between neighboring light emitting devices within any one of the groups.

5. The module according to claim 1, wherein at least some of the plurality of light emitting devices is disposed in a given direction according to turn-on frequency ranking.

6. The module according to claim 1, wherein the disposition density of the plurality of light emitting devices varies according to positions on the body.

7. The module according to claim 3, wherein the plurality of groups is spaced apart from one another by different distances.

8. The module according to claim 1, wherein the disposition density of the light emitting devices is even on the body.

9. The module according to claim 3, wherein each of the plurality of groups has the same disposition density of the light emitting devices.

10. The module according to claim 3, wherein the light emitting devices included in at least one of the groups have the same turn-on ranking.

11. The module according to claim 3, wherein the light emitting devices included in at least one of the groups have different turn-on rankings.

12. The module according to claim 3, wherein a distance between neighboring groups among the plurality of groups is within an angular range of 40° to 90° about the point.

13. The module according to claim 3, wherein a distance between neighboring light emitting devices included in any one of the plurality of groups is within an angular range of 30° to 80° about the point.

14. The module according to claim 3, wherein each of the plurality of groups includes a pair of light emitting devices.

15. A light emitting module, comprising:
a body;
a plurality of light emitting devices spaced equally on the body about one point in a radial direction, the light emitting devices being grouped into a plurality of different groups; and
a turn-on controller configured to control turn-on of the plurality of light emitting devices,
wherein at least some neighboring light emitting devices among the plurality of light emitting devices are spaced apart from one another by different distances, and
wherein the sum of turn-on frequency rankings of the light emitting devices included in each of the plurality of groups is equal.

16. The module according to claim 15, wherein the plurality of groups is equidistantly spaced apart from one another.

17. A light emitting module, comprising:
a body;
a plurality of light emitting devices symmetrically disposed on the body about any one line that extends across an upper surface of the body; and
a turn-on controller configured to control turn-on of the plurality of light emitting devices,
wherein at least some neighboring light emitting devices among the plurality of light emitting devices are spaced apart from one another by different distances.

18. The module according to claim 17, wherein some of the plurality of light emitting devices disposed at one side of the line are connected to one another in series to constitute a first light emitting array,
   wherein some of the plurality of light emitting devices disposed at the other side of the line are connected to one another in series to constitute a second light emitting array, and
   wherein the turn-on controller sequentially turns on the light emitting devices of the first and second light emitting arrays in proportion to the level of power applied from an external source.

19. The module according to claim 18, wherein the turn-on controller sequentially turns off the light emitting devices of the first and second light emitting arrays in proportion to the level of power applied from the external source.

* * * * *